(12) United States Patent
Bossen

(10) Patent No.: US 7,660,475 B2
(45) Date of Patent: Feb. 9, 2010

(54) METHOD AND APPARATUS FOR CODING POSITIONS OF COEFFICIENTS

(75) Inventor: Frank Bossen, San Jose, CA (US)

(73) Assignee: NTT DoCoMo, Inc., Tokyo (JP)

( * ) Notice: Subject to any disclaimer, the term of this patent is extended or adjusted under 35 U.S.C. 154(b) by 631 days.

(21) Appl. No.: 11/172,052

(22) Filed: Jun. 29, 2005

(65) Prior Publication Data

US 2006/0133680 A1    Jun. 22, 2006

Related U.S. Application Data

(60) Provisional application No. 60/639,430, filed on Dec. 22, 2004.

(51) Int. Cl.
*G06K 9/36* (2006.01)

(52) U.S. Cl. .................................... 382/240

(58) Field of Classification Search ......... 382/232–233, 382/236, 238–239, 245–248, 253; 375/240.22, 375/240.12, 240.18–240.19, 240.24; 348/394.1–395.1, 348/402.1–404.1, 420.1–421.1, 424.2; 341/51
See application file for complete search history.

(56) References Cited

U.S. PATENT DOCUMENTS

| | | | | |
|---|---|---|---|---|
| 5,263,124 | A * | 11/1993 | Weaver et al. ................. 382/159 |
| 5,274,718 | A * | 12/1993 | Leonardi et al. ............ 382/240 |
| 5,335,088 | A * | 8/1994 | Fan ............................ 382/237 |
| 5,379,355 | A * | 1/1995 | Allen ......................... 382/238 |
| 5,550,541 | A * | 8/1996 | Todd .......................... 341/51 |
| 5,907,637 | A * | 5/1999 | Murashita et al. ........... 382/239 |
| 6,101,275 | A * | 8/2000 | Coppersmith et al. ....... 382/226 |
| 6,108,381 | A * | 8/2000 | Pau et al. .................. 375/240.22 |
| 6,320,907 | B1 * | 11/2001 | Pau et al. .................. 375/240.22 |
| 7,016,547 | B1 * | 3/2006 | Smirnov ..................... 382/245 |
| 7,187,804 | B2 * | 3/2007 | Zhao et al. ................. 382/244 |
| 7,286,710 | B2 * | 10/2007 | Marpe et al. ................ 382/239 |
| 7,379,608 | B2 * | 5/2008 | Marpe et al. ................ 382/247 |

OTHER PUBLICATIONS

International PCT Search Report and Written Opinion, PCT/US2005/045670, Int'l. filing date: Dec. 15, 2005, mailing date: Apr. 11, 2006 (8 pgs.).

Jechang Jeong, et al., "Adaptive Huffman coding of 2-D DCT coefficients for image sequence compression", Signal Processing: Image Communication, Elsevier Science Publishers, Amsterdam, NL, vol. 7, No. 1, Mar. 1995, pp. 1-11.

Byeungwoo Jeon, et al., "Huffman coding of DCT coefficients using dynamic codeword assignment and adaptive codebook selection", Signal Processing: Image Communication, Elsevier Science Publishers, Amsterdam, NL, vol. 12, No. 3, Jun. 1998, pp. 253-262.

Seung Bae Choi, et al., "High Speed Pattern Matching for a Fast Huffman Decoder", IEEE Transactions on Consumer Electronics, IEEE Service Center, New York, NY, USA, vol. 41, No. 1, Feb. 1, 1995, pp. 97-103.

PCT Written Opinion for PCT/US2005/045670, mailed Jul. 5, 2007, (7 pages).

* cited by examiner

*Primary Examiner*—Jose L Couso
(74) *Attorney, Agent, or Firm*—Blakely, Sokoloff, Taylor & Zafman LLP

(57) ABSTRACT

A method and apparatus for coding positions of data such as coefficients are described. In one embodiment, the method comprises coding data in a vector of data based on indications of whether the data is zero or non-zero identified using a tree data structure and producing a bit stream based on coded data.

56 Claims, 13 Drawing Sheets

METHOD AND APPARATUS FOR CODING POSITIONS OF COEFFICIENTS

PRIORITY

The present patent application claims priority to the corresponding provisional patent application Ser. No. 60/639,430, titled, "Method and Apparatus for Coding Positions of Non-zero Coefficients in a Block," filed on Dec. 22, 2004.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to the field of coding; more particularly, the present invention relates to coding of certain coefficients (e.g., non-zero coefficients) in a group (e.g., a block of coefficients).

BACKGROUND OF THE INVENTION

Data compression is an extremely useful tool for storing and transmitting large amounts of data. For example, the time required to transmit an image, such as a network transmission of a document, is reduced drastically when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner that allows for perfect reconstruction.

In image and video coders, images are typically partitioned into sets of blocks. Each block is transformed and quantized into a set of coefficients. The coefficients may be created by applying transforms (e.g., a Discrete Cosine Transform (DCT), a wavelet transform) to data. For example, in JPEG, a DCT transform is applied to image data to create coefficients. Subsequently, these coefficients may be quantized. For each block, information describing which coefficients have a non-zero value must be transmitted.

Quantized coefficients are typically arranged into a one-dimensional array of values. The ordering of coefficients within the array is determined by a scan order, for example a zig-zag scan order. The positions of non-zero coefficients are then coded using run-length coding methods.

Scanning methods often have limited efficiency. For example, with respect to the zig-zag scanning method, when a block contains either only horizontal or vertical frequencies, a large number of zero coefficients are visited along the zig-zag pattern resulting in inefficiencies.

SUMMARY OF THE INVENTION

A method and apparatus for coding positions of data such as coefficients are described. In one embodiment, the method comprises coding data in a vector of data based on indications of whether the data is zero or non-zero identified using a tree data structure and producing a bit stream based on coded data.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1A:
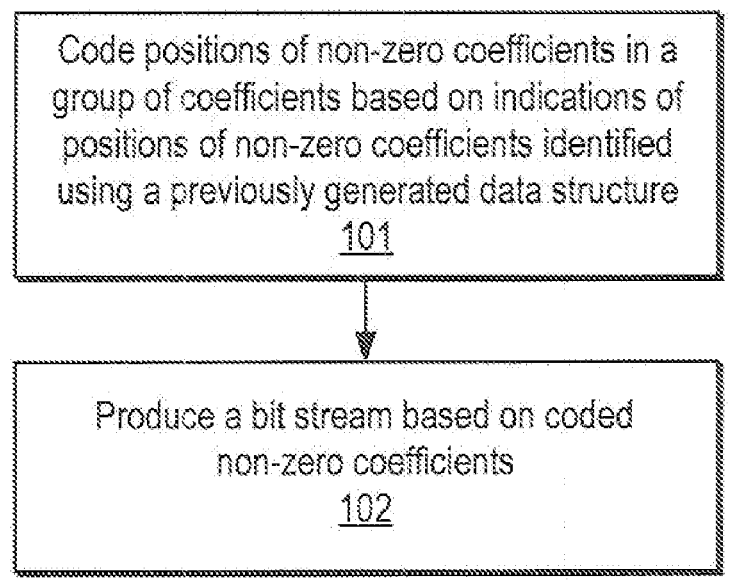
FIG. 1A is a flow diagram of one embodiment of a process for encoding data

A method and an apparatus for coding positions of coefficients (e.g., non-zero coefficients) in a group of data (e.g., a block of data) are described. In one embodiment, the coefficients are arranged into a binary tree. The tree is traversed to code the position of non-zero coefficients. Embodiments of the present invention provide an alternative to coding coefficients using the traditional zig-zag scan and rely on organizing coefficients in a tree, thereby providing more flexibility and efficiency than a single scan.

Although embodiments that follow will be described as operating with coefficients, it would be apparent to those skilled in the art that the techniques described herein apply to any vector of data.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Overview

FIG. 1A is a flow diagram of one embodiment of a process for encoding data. The process is performed by processing logic that may comprise hardware (e.g., circuitry, dedicated logic, etc.), software (such as is run on a general purpose computer system or a dedicated machine), or a combination of both. The process may be performed by firmware.

Referring to FIG. 1A, the process begins by processing logic coding positions of non-zero coefficients in a group of coefficients based on indications of positions of non-zero coefficients identified using a previously generated data structure (processing block 101). In one embodiment, the data structure represents a tree. The tree may be a binary tree. In one embodiment, the group of coefficients comprises a block of coefficients.

Next, processing logic produces a bit stream based on coded non-zero coefficients (processing block 102).

Figure 1B:
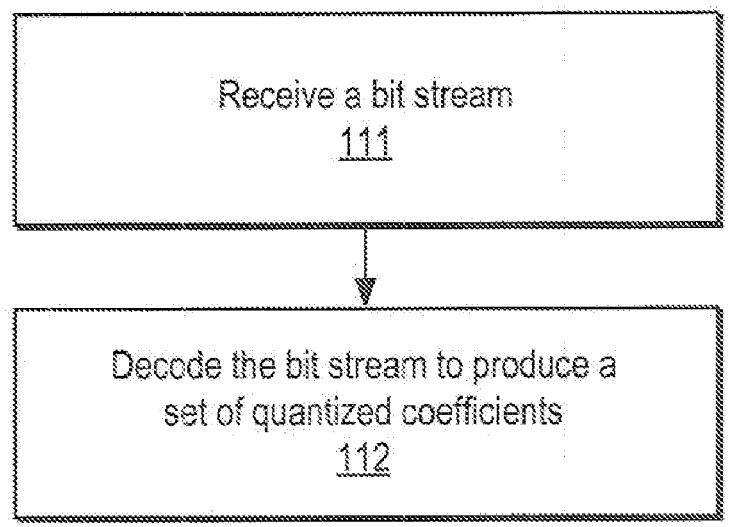
FIG. 1B is a flow diagram of one embodiment of a process for decoding data.

FIG. 1B is a flow diagram of one embodiment of a process for decoding data. The process is performed by processing logic that may comprise hardware (e.g., circuitry, dedicated logic, etc.), software (such as is run on a general purpose computer system or a dedicated machine), or a combination of both. The process may be performed by firmware.

Referring to FIG. 1B, the process begins by processing logic receiving a bit stream (processing block 111). Next, processing logic decodes the bit stream to produce a set of quantized coefficients, including using a previously generated data structure to produce positions of quantized coefficients in a group of coefficients based on indications of positions of quantized coefficients identified by the previously generated data structure (processing block 112).

In one embodiment, the data structure represents a tree. The tree may be a binary tree. In one embodiment, the group of coefficients comprises a block of coefficients.

Figure 2:
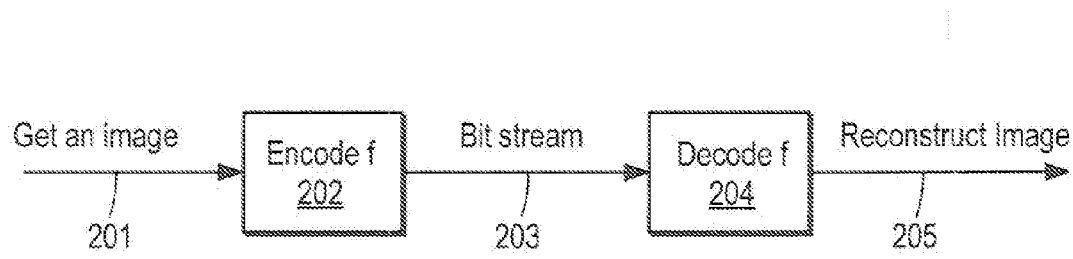
FIG. 2 is a block diagram of one embodiment of an encoder and decoder system.

FIG. 2 is a block diagram of one embodiment of an encoder and decoder system. Some systems may only include an encoder or a decoder.

Referring to FIG. 2, encoder 202 converts a source image 201 into a bit stream 203, which is a compressed representation of source image 201. Decoder 204 converts the bit stream 203 into a reconstructed image 205, which is an approximation (in a lossy compression configuration) or an exact copy (in a lossless compression configuration) of source image 201. Bit stream 203 may be sent from encoder 202 to decoder 203 over a communication channel (such as, for example, the Internet) or over physical media (such as, for example, a CD-ROM).

Figure 3:
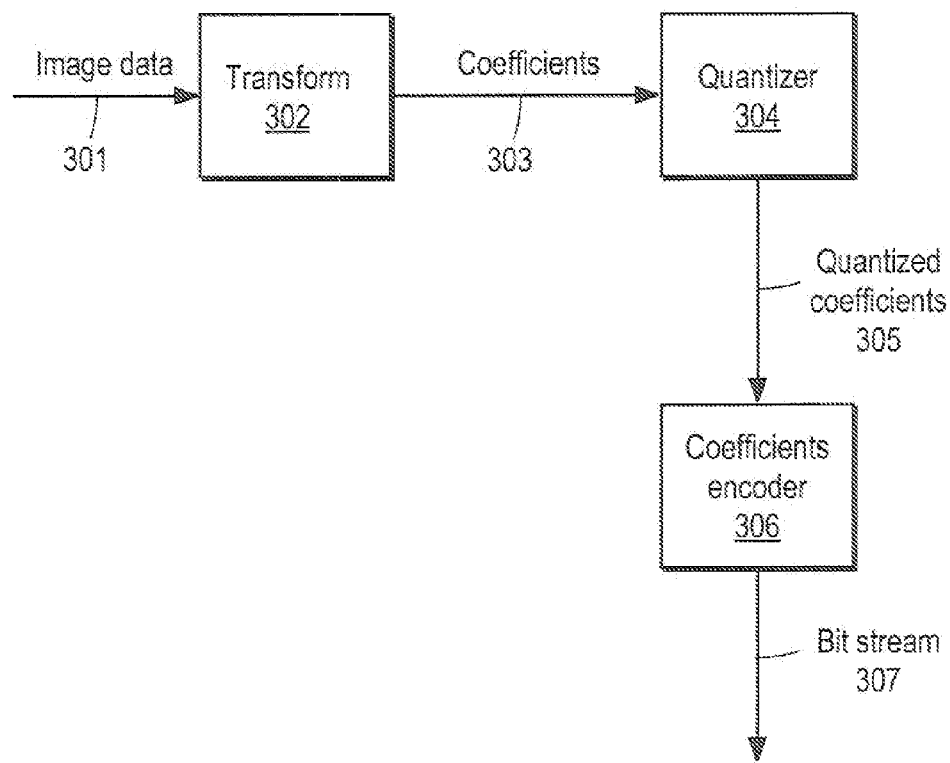
FIG. 3 is a block diagram of one embodiment of a transform encoder is a block diagram of one embodiment of a transform encoder.

FIG. 3 is a block diagram of one embodiment of a transform encoder. The transform encoder of FIG. 3 may be a component of encoder 202 of FIG. 2. The encoder may partition the source image into one or more blocks of image data, for example, blocks of size 4 by 4 or 8 by 8. Other groupings of image data may be used.

Referring to FIG. 3, transform unit 302 converts a block of image data 301 into a set of coefficients 303. In one embodiment, transform unit 302 may implement the discrete cosine transform (DCT). A quantizer 304 converts coefficients 303 into a set of quantized coefficients 305. In one embodiment, a coefficient may take a real value, and the value of quantized coefficients 305 is limited to integer numbers. In one embodiment, quantizer 304 divides each coefficient by a given number and rounds the result to the nearest integer to produce a quantized coefficient. Coefficient encoder 306 converts quantized coefficients 305 into a bit stream 307. In one embodiment, bit stream 307 is an ordered set of bits including a representation of quantized coefficients 305. In one embodiment, coefficient encoder 306 uses Huffman coding. Alternately, coefficient encoder 306 uses arithmetic coding alone or in conjunction with Huffman coding. Other coding schemes may be used as well.

Figure 4:
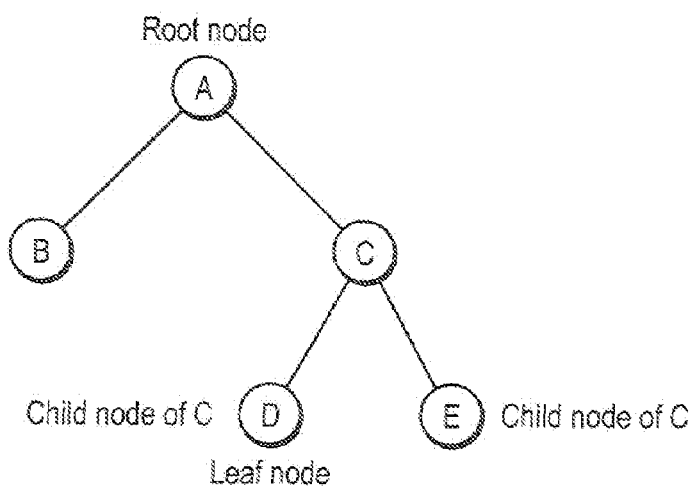
FIG. 4 is an example of tree structure data.

For purposes herein, terminology for describing trees will be used as follows. FIG. 4 is an example of a binary tree. Referring to FIG. 4, the tree contains five nodes A, B, C, D and E. Node A is the root node. Nodes D and E are referred to herein as child nodes of C. Node D is an example of a leaf node. Leaf nodes do not have child nodes. Nodes B and E are also leaf nodes.

While the descriptions henceforth consider binary trees, non-binary trees (e.g., ternary trees) may also be used.

Figure 17:
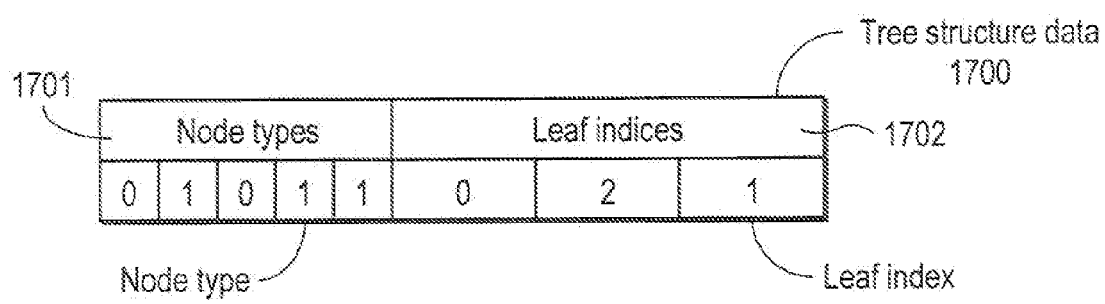
FIG. 17 illustrates an example of a representation of the tree structure of FIG. 4.

FIG. 17 is an example of tree structure data. Referring to FIG. 17, tree structure data may contain node types data 1701 and leaf indices data 1702. Node types data 1701 contains a node type for each node in a tree, such as the binary tree of FIG. 4. For example, a value 0 may be used for a node that is not a leaf node and a value 1 for a node that is a leaf node. In one embodiment, the ordering of the node types is determined by a depth-first traversal of the tree. Alternatively, a breadth-first traversal is used. Leaf indices data 1702 contains a coefficient index for each leaf in the tree. The index at a leaf of the tree represents an index into the array of quantized coefficients. In one embodiment, the ordering of the leaf indices may be determined by a depth-first traversal of the tree. Alternatively, a breadth-first traversal is considered. In the example of FIG. 17, the tree depicted in FIG. 4 is described and assumes that node B has index 0, node D index 2, and node E index 1.

Figure 5:
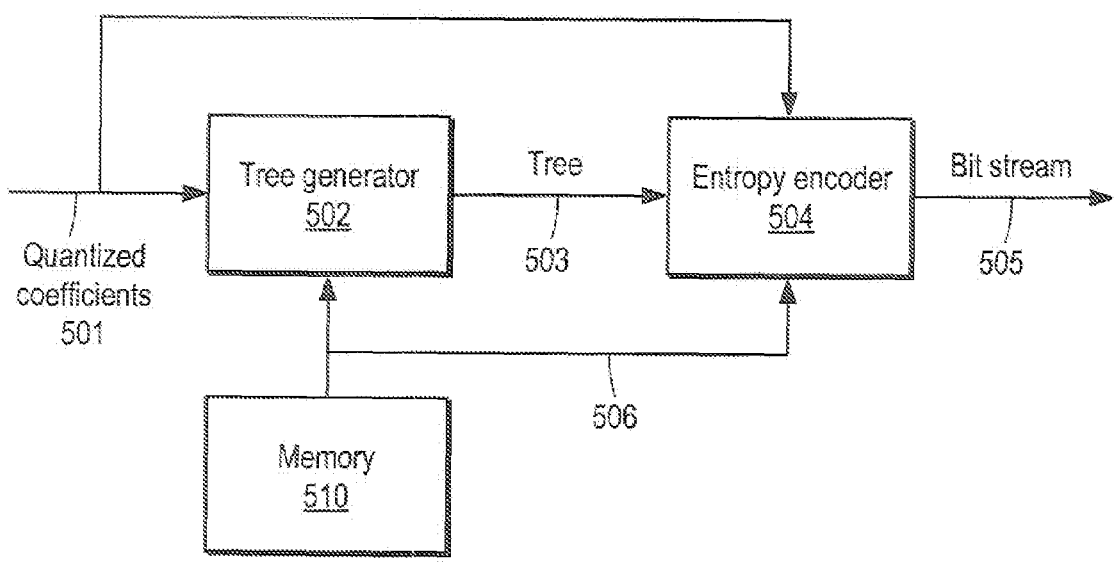
FIG. 5 is a block diagram of one embodiment of a coefficient encoder

FIG. 5 is a block diagram of one embodiment of a coefficient encoder. Referring to FIG. 5, a tree generator 502 receives quantized coefficients 501 and retrieves tree structure data from a memory 510. Tree structure data 506 describes a binary tree. In one embodiment, tree structure data 506 includes information relating to the topology of the tree, as well as an index for each leaf in the tree. Tree generator 502 assigns a value to each node of the tree. First, tree generator 502 assigns a zero value to each leaf of the tree if the corresponding quantized coefficient is equal to zero. Otherwise, tree generator 502 assigns a non-zero value to the leaf. Next, values are recursively assigned to each node in the tree that is not a leaf. Each such node has two children. If both children have value zero, a zero value is assigned to the node. Otherwise, tree generator 502 assigns a non-zero value to the node. Tree 503 with values assigned to its nodes is transmitted to entropy encoder 504.

Entropy encoder 504 receives tree 503 from tree generator 502 and quantized coefficients 501. Entropy encoder 504 further retrieves tree structure data 506 from memory 510. Entropy encoder 504 encodes the values assigned to the nodes of tree 503 as further detailed below. Then, for each quantized coefficient that is non-zero, entropy encoder 504 encodes the value of the quantized coefficient. In one embodiment, the encoding of the tree and the coefficients is performed using Huffman coding. In another embodiment, arithmetic coding is used; however, any coding scheme may be used. The output of entropy encoder 504 is a bit stream 505 containing the coded information.

Optionally, entropy encoder 504 may also insert tree structure data in bit stream 505 retrieved from memory 510. In one embodiment, tree structure data is inserted with the bitstream in encoded form. The node type information may be encoded with 1 bit per node, indicative of whether the node is a leaf or not. Information about the leaf indices may be encoded with a number of bits dependent on the size of the tree. For example, a tree with three leaf indices could encode those indices with two bits, while a tree with 16 leaf indices could encode those indices with four bits. Generally, the number of bits necessary is approximately equal to $\log_2$ (number of leaf indices). The tree structure data may be sent at different times. For example, in alternative embodiments, the tree structure data may be sent once per picture, once per group of pictures, or once for an entire video sequence.

Figure 6:
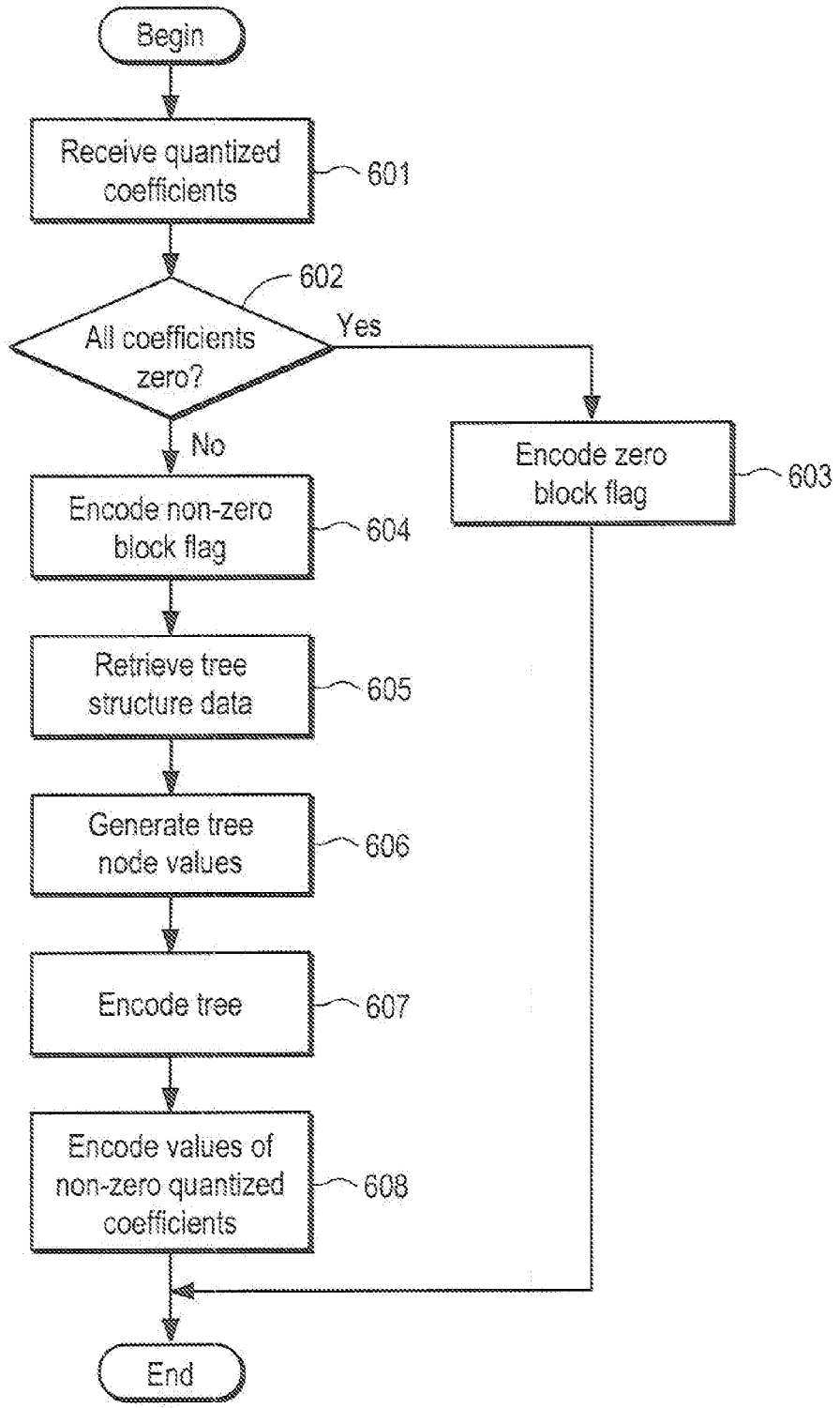
FIG. 6 is a flow diagram of one embodiment of an encoding process performed by a coefficient encoder.

FIG. 6 is a flow diagram of one embodiment of an encoding process performed by a coefficient encoder. The process is performed by processing logic of the coefficient encoder that may comprise hardware (circuitry, dedicated logic, etc.), software (such as is run on a general purpose computer system or a dedicated machine), or a combination of both. The processing logic may comprise firmware.

Referring to FIG. 6, the process begins by processing logic receiving quantized coefficients, for example, from a quantizer (processing block 601). Processing logic then tests whether all of the coefficients are zero (processing block 602). If all coefficients are zero, a flag identifying that all coefficients are zero and the process ends. Otherwise, processing logic encodes a flag identifying that at least one coefficient in the block is not equal to zero (processing block 602), retrieves tree structure data from a memory (processing block 605), and assigns values to each node in the tree based on the quantized coefficients as further described below (processing 606). In other words, processing logic generates tree node values.

After generating tree node values, processing logic encodes the values assigned to each node in the tree, as further described below (processing block 607). After encoding the tree, processing logic encodes the values of non-zero quantized coefficients (processing block 608). In one embodiment, the Huffman coding is used. Alternately, arithmetic coding or another coding scheme may be used.

Figure 7:
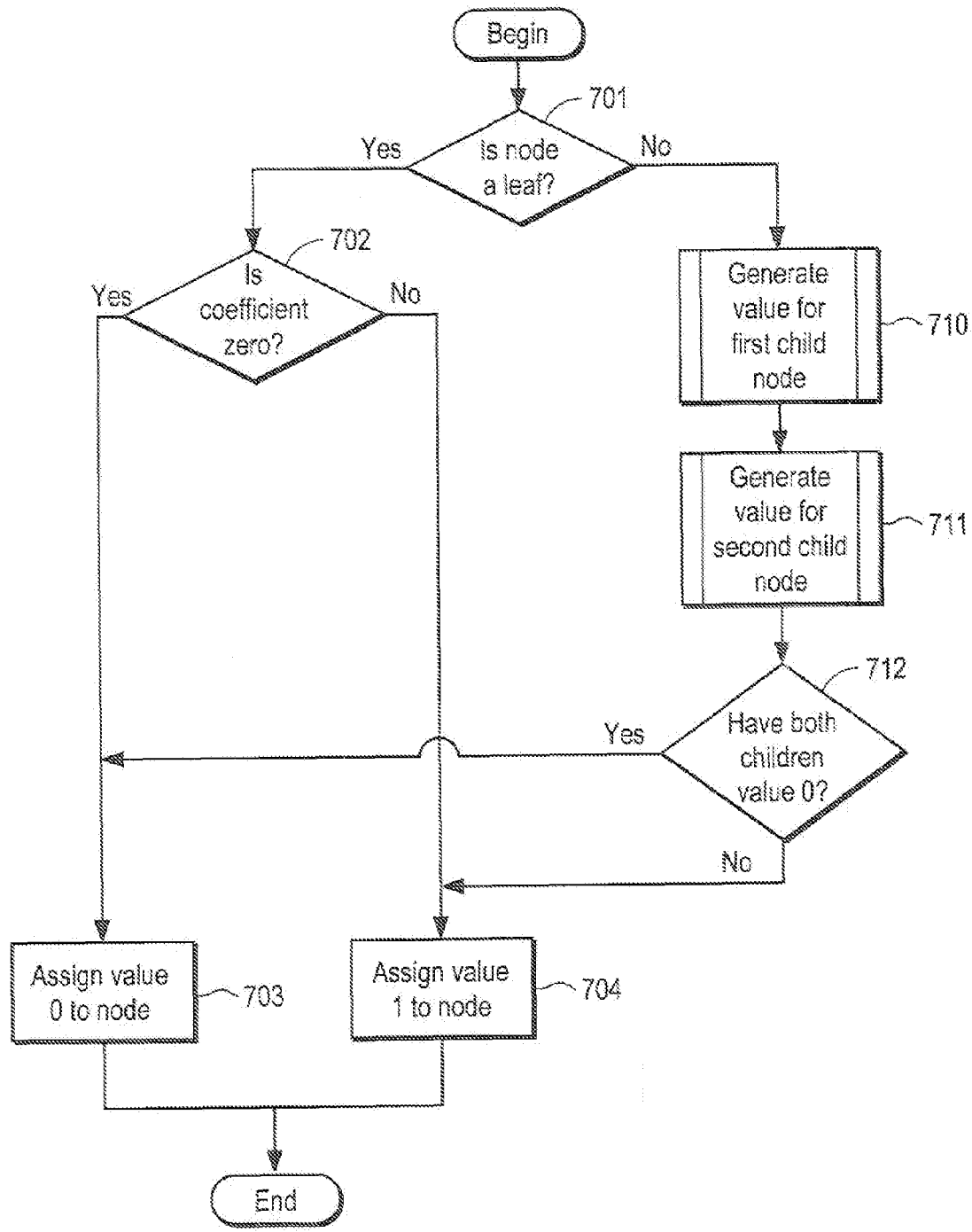
FIG. 7 is a flow diagram of one embodiment of a process for assigning values to the nodes of a tree.

FIG. 7 is a flow diagram of one embodiment of a process for assigning values to the nodes of a tree. The process is performed by processing logic that may comprise hardware (circuitry, dedicated logic, etc.), software (such as is run on a general purpose computer system or a dedicated machine), or a combination of both.

The process starts with the current node set to the root node. Referring to FIG. 7, processing logic determines whether the current node is a leaf node (processing block 701). If the current node is a leaf node, processing logic determines whether the quantized coefficient associated with the current node is a zero coefficient (processing block 702). If the coefficient is zero, processing logic assigns a value of 0 to the current node (processing block 703) and the process ends; otherwise, processing logic assigns a value of 1 to the current node (processing block 704) and the process ends.

If the current node is not a leaf node, the process transitions to processing block 710 where processing logic recursively executes the process of FIG. 7 with a first child of the current node as the current node (processing block 710), and then recursively executes the process of FIG. 7 a second time with the second child of the current node as the current node (processing block 711).

Afterwards, processing logic determines whether both child nodes have an assigned value of 0 (processing block 712). If both child nodes have a value of 0, processing logic assigns a value of 0 to the current node (processing block 703) and the process ends; otherwise, processing logic assigns a value of 1 to the current node (processing block 704) and the process ends.

After the process has ended where the current node is set to the root node, all nodes in the tree have an assigned value of 0 or 1. The root node has value 1 if one or more coefficients are not equal to zero.

Figure 8:
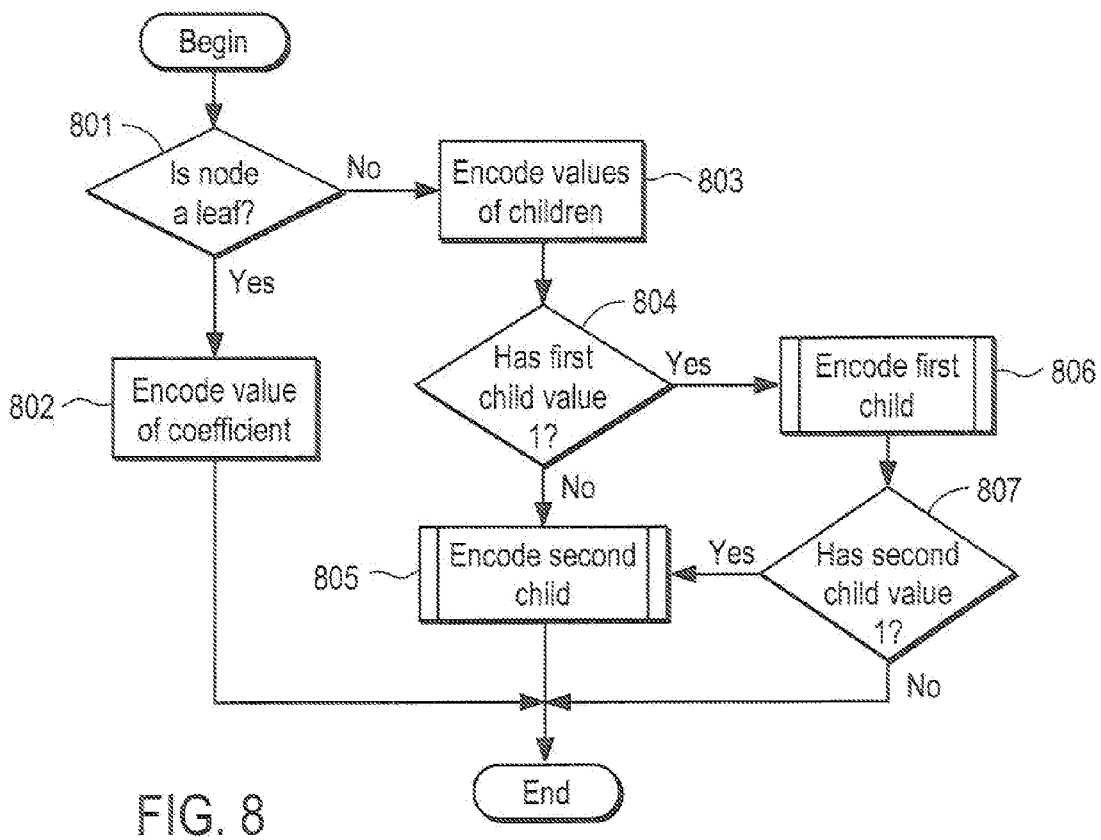
FIG. 8 is a flow diagram of one embodiment of a process for encoding of a node in the tree.

FIG. 8 is a flow diagram of one embodiment of a process for encoding of a node in the tree. The process is performed by processing logic that may comprise hardware (e.g., circuitry, dedicated logic, etc.), software (such as is run on a general purpose computer system or a dedicated machine), or a combination of both. The processing logic may also comprise firmware.

Referring to FIG. 8, the process is initially invoked with the root node as argument. The process begins by processing logic determining whether the node is a leaf (processing block 801). If the node is a leaf, processing logic encodes the value of its corresponding coefficient (processing block 802) and the process ends. Various encoding schemes may be used (e.g., Huffman coding, arithmetic coding, etc.).

If the node is not a leaf, processing logic encodes the values of its two children (processing block 803). The encoding is further described below. Then, processing logic tests whether the first child has a value of 1 (processing block 804). If the first child has value 1, processing block recursively execute the node encoding process with the first child as an argument (processing block 806). Processing logic then tests whether the second child value is 1 (processing block 807). If the first child has value 0 or the second child has value 1, processing logic recursively executes the node encoding process with the second child as an argument (processing block 805). Thereafter, the process ends.

Figure 9:
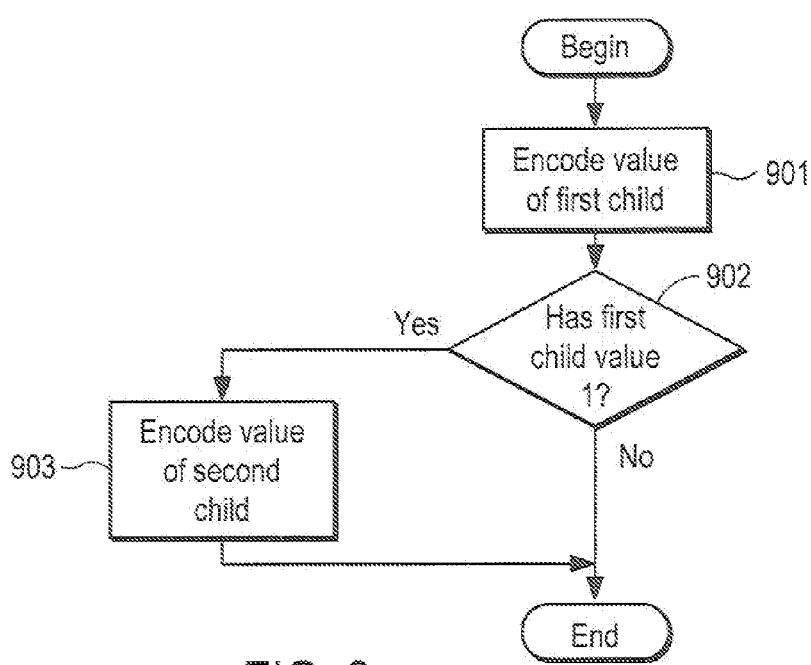
FIG. 9 is a flow diagram of one embodiment of a process for encoding of the values of child nodes.

FIG. 9 is a flow diagram of one embodiment of a process for encoding of the values of child nodes. The process is performed by processing logic that may comprise hardware (e.g., circuitry, dedicated logic, etc.), software (such as is run on a general purpose computer system or a dedicated machine), or a combination of both. The processing logic may also comprise firmware.

Referring to FIG. 9, the process begins by processing logic encoding the value of the first child (processing block 901). In one embodiment, the value is encoded as a single bit appended to a bit stream. Alternatively, the value is further compressed using an arithmetic coder.

Processing logic then determines whether the first child value is 1 (processing block 902). If the value of the first child is equal to 0, the process ends. Otherwise, processing logic encodes the value of the second child (processing block 903). In one embodiment, the value is encoded as a single bit appended to a bit stream. Alternatively, the value is further compressed using an arithmetic coder. After encoding the value of the second child, the process ends.

Figure 10:
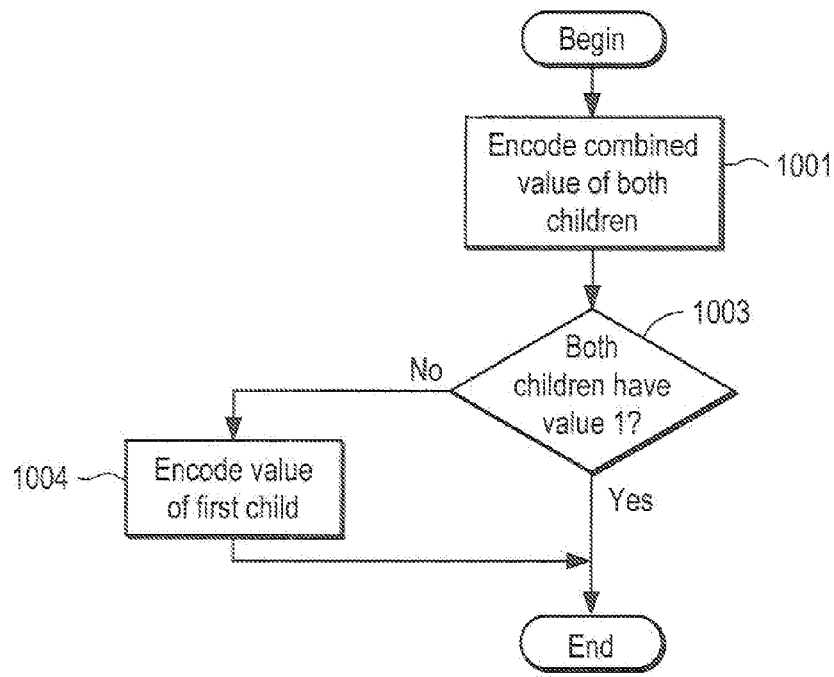
FIG. 10 is a flow diagram of another embodiment of a process for encoding of the values of child nodes

FIG. 10 is a flow diagram of another embodiment of a process for encoding of the values of child nodes. Note that this is an alternative embodiment to the process set forth in FIG. 9. Alternatively, the selection of the method may be done on a node basis. The selection information may be stored in the memory and encoded into the bit stream. Such an encoding may be done using a bit to indicate the selected method. Alternatively, both the encoder and decoder may have a predetermined agreement on which method to use for each node.

The process of FIG. 10 is performed by processing logic that may comprise hardware (e.g., circuitry, dedicated logic, etc.), software (such as is run on a general purpose computer system or a dedicated machine), or a combination of both. The processing logic may also comprise firmware.

Referring to FIG. 10, the process begins by processing logic encoding the combined value of two child nodes (processing block 1001). In one embodiment, the combined value is determined by the result of a logical AND operation between the values of both children. Processing logic then determines whether both children have a value of 1 (processing block 1003). If the coded value is 1, then the process ends. Otherwise, processing logic encodes the value of the first child (processing block 1004) and the process ends. In one embodiment, when encoding a value, the value is directly appended to a bit stream. Alternatively, the value may be further compressed using an arithmetic coder.

Alternatively, a ternary alphabet may be used to represent the values of the child nodes. In such a case, a single symbol is added to the bit stream.

Figure 11:
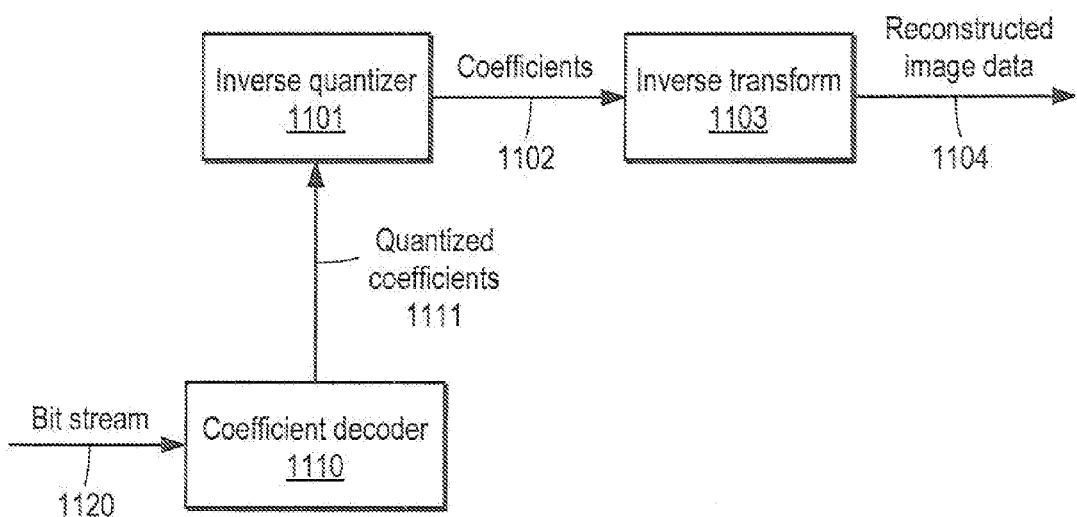
FIG. 11 is a block diagram of one embodiment of a transform decoder.

FIG. 11 is a block diagram of one embodiment of a transform decoder. Referring to FIG. 11, a bit stream 1120 is input to a coefficient decoder 1110. Coefficient decoder 1110 converts bits from bit stream 1120 into a set of quantized coefficients 1111. The conversion process is further described below. An inverse quantizer 1101 scales quantized coefficients 1111 into a set of coefficients 1102. An inverse transform 1103 converts coefficients 1102 into reconstructed image data 1104.

Figure 12:
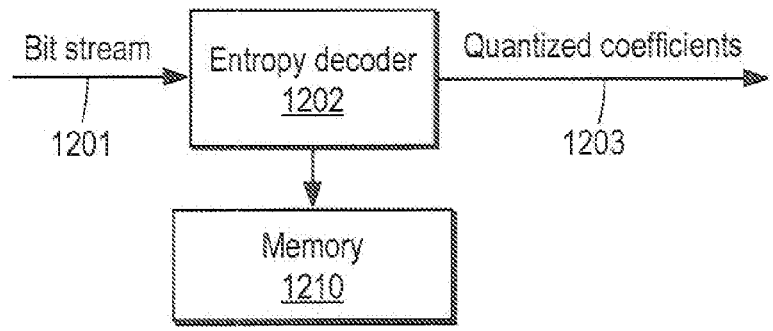
FIG. 12 is a block diagram of one embodiment of a coefficient decoder.

FIG. 12 is a block diagram of one embodiment of a coefficient decoder. Referring to FIG. 12, an entropy decoder 1202 converts bits from a bit stream 1201 into a set of quantized coefficients 1203, as further detailed below. To this end, entropy decoder 1202 relies on tree structure data stored in a memory 1210. Entropy decoder 1202 may also read the tree structure data from bit stream 1201 and stores it into memory 1210.

Figure 13:
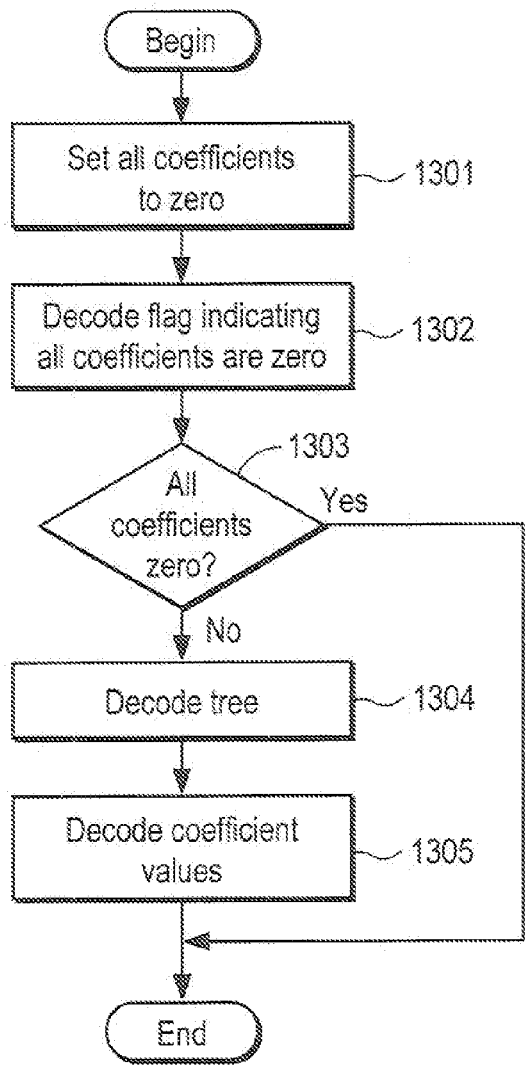
FIG. 13 is a flow diagram of one embodiment of a process for decoding of quantized coefficients.

FIG. 13 is a flow diagram of one embodiment of a process for decoding of quantized coefficients. The process is performed by processing logic that may comprise hardware (e.g., circuitry, dedicated logic, etc.), software (such as is run on a general purpose computer system or a dedicated machine), or a combination of both. The processing logic may also comprise firmware.

Referring to FIG. 13, the process begins by processing logic setting all coefficients in the set to zero (processing block 1301). After setting coefficients to zero, processing logic decodes a flag (processing block 1302). Processing logic then determines whether all coefficients are zero (processing block 1303). If the flag takes a first value indicating that all coefficients are zero, the process ends. Otherwise, processing logic decodes node values in a tree (processing block 1304) along with coefficient values (processing block 1305), as further described below. Then the process ends.

Figure 14:
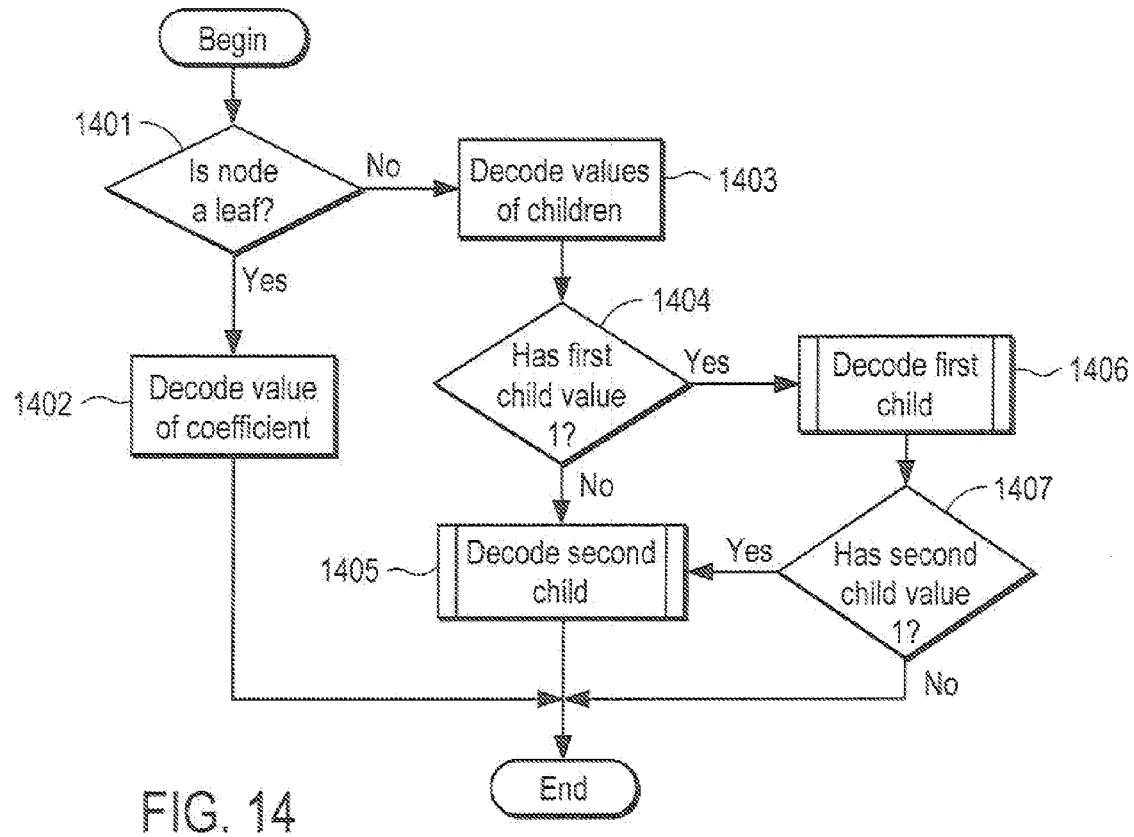
FIG. 14 is a flow diagram of one embodiment of a process for decoding of a node.

FIG. 14 is a flow diagram of one embodiment of a process for decoding of a node. The process is performed by processing logic that may comprise hardware (e.g., circuitry, dedicated logic, etc.), software (such as is run on a general purpose computer system or a dedicated machine), or a combination of both. The processing logic may also comprise firmware.

Referring to FIG. 14, the process begins with the root node as argument. Processing logic determines whether the node is a leaf (processing block 1401). If the node is a leaf node, processing logic further decodes the value of the coefficient (processing block 1402) and thereafter the process ends. The decoding may be performed using various decoding techniques (e.g., Huffman coding, arithmetic coding, etc.).

If the node is not a leaf, processing logic decodes the values of its two children (processing block 1403). The decoding is further described below. Then, processing logic tests whether the first child has a value of 1 (processing block 1404). If the first child has value 1, processing block recursively execute the node decoding process with the first child as an argument (processing block 1406). Processing logic then tests whether the second child value is 1 (processing block 1407). If the first child has value 0 or the second child has value 1, processing logic recursively executes the node decoding process with the second child as an argument (processing block 1405). Thereafter, the process ends.

Figure 15:
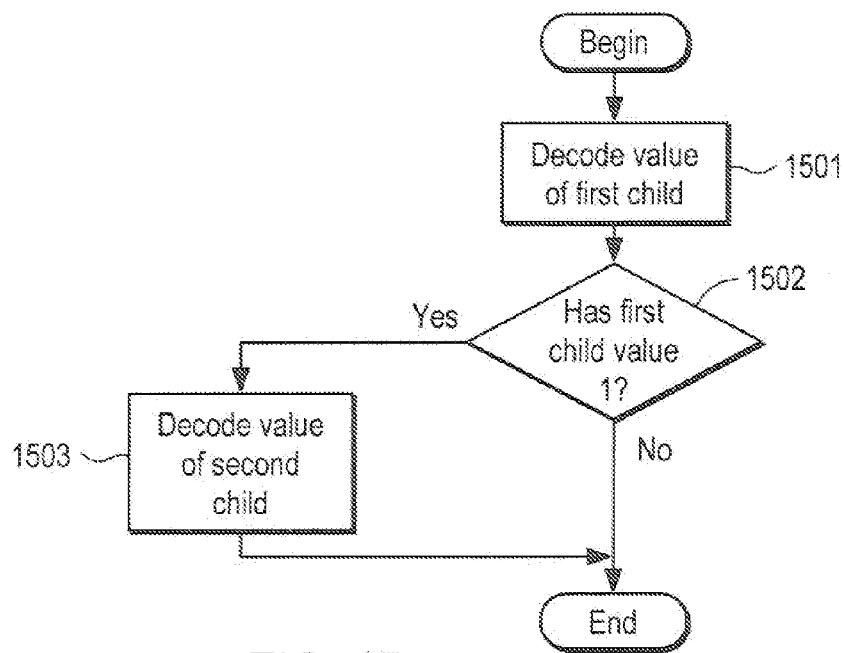
FIG. 15 is a flow diagram of one embodiment of a process for decoding of the values of the child nodes.

FIG. 15 is a flow diagram of one embodiment of a process for decoding of the values of the child nodes. The process is performed by processing logic that may comprise hardware (e.g., circuitry, dedicated logic, etc.), software (such as is run on a general purpose computer system or a dedicated machine), or a combination of both. The processing logic may also comprise firmware.

Referring to FIG. 15, the process begins by decoding the value of the first child (processing block 1501). The decoding process may involve retrieving a single bit from a bit stream or decoding a binary symbol from the bit stream with an arithmetic decoder. Processing logic determines if the first child value is 1 (processing block 1502). If the decoded value is 0, the process ends; otherwise, if the value is 1, processing logic decodes the value of the second child, similarly to the first value (processing block 1503) and then the process ends.

Figure 16:
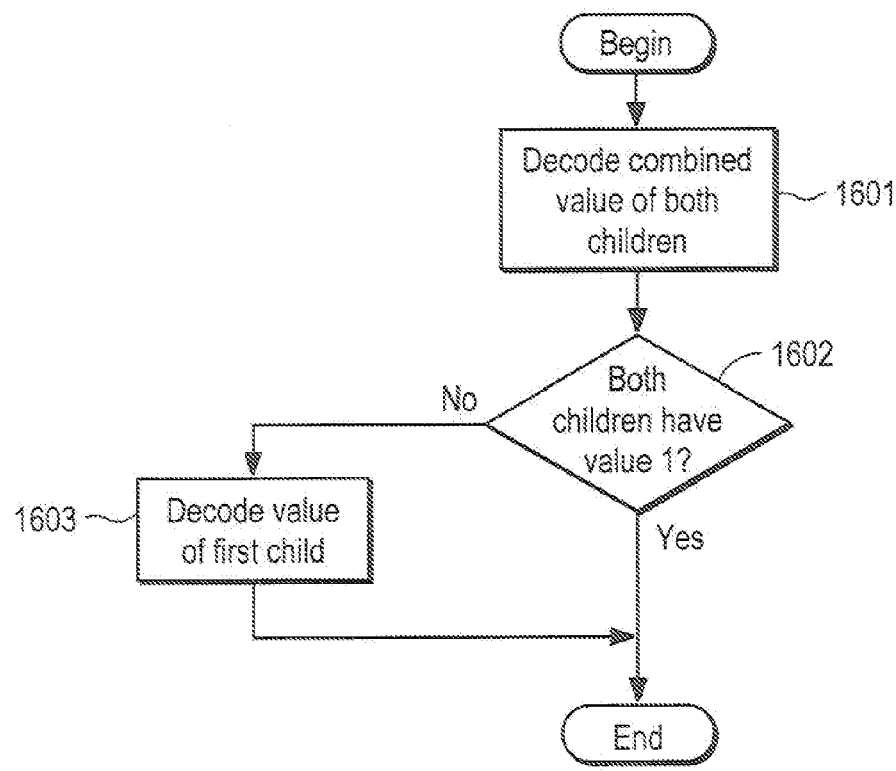
FIG. 16 is a flow diagram of an alternative embodiment of a process for decoding of the values of the child nodes.

FIG. 16 is a flow diagram of an alternative embodiment of a process for decoding of the values of the child nodes. The process is performed by processing logic that may comprise hardware (e.g., circuitry, dedicated logic, etc.), software (such as is run on a general purpose computer system or a dedicated machine), or a combination of both. The processing logic may also comprise firmware.

Referring to FIG. 16, the process begins decoding the combined value of both children (processing block 1601). The combined value may indicate whether both children have value 1 or not. Processing logic determines if both children have a value of 1 (processing block 1602). If both children have a value of 1, the process ends; otherwise, if the value is 1, processing logic decodes the value of the first child and sets the value of the second child to the opposite value (processing block 1603) and then the process ends.

Alternatively, the value of both child nodes may be represented with a ternary alphabet. In such a case, a single symbol may be decoded to obtain the values of the child nodes.

Figure 18:
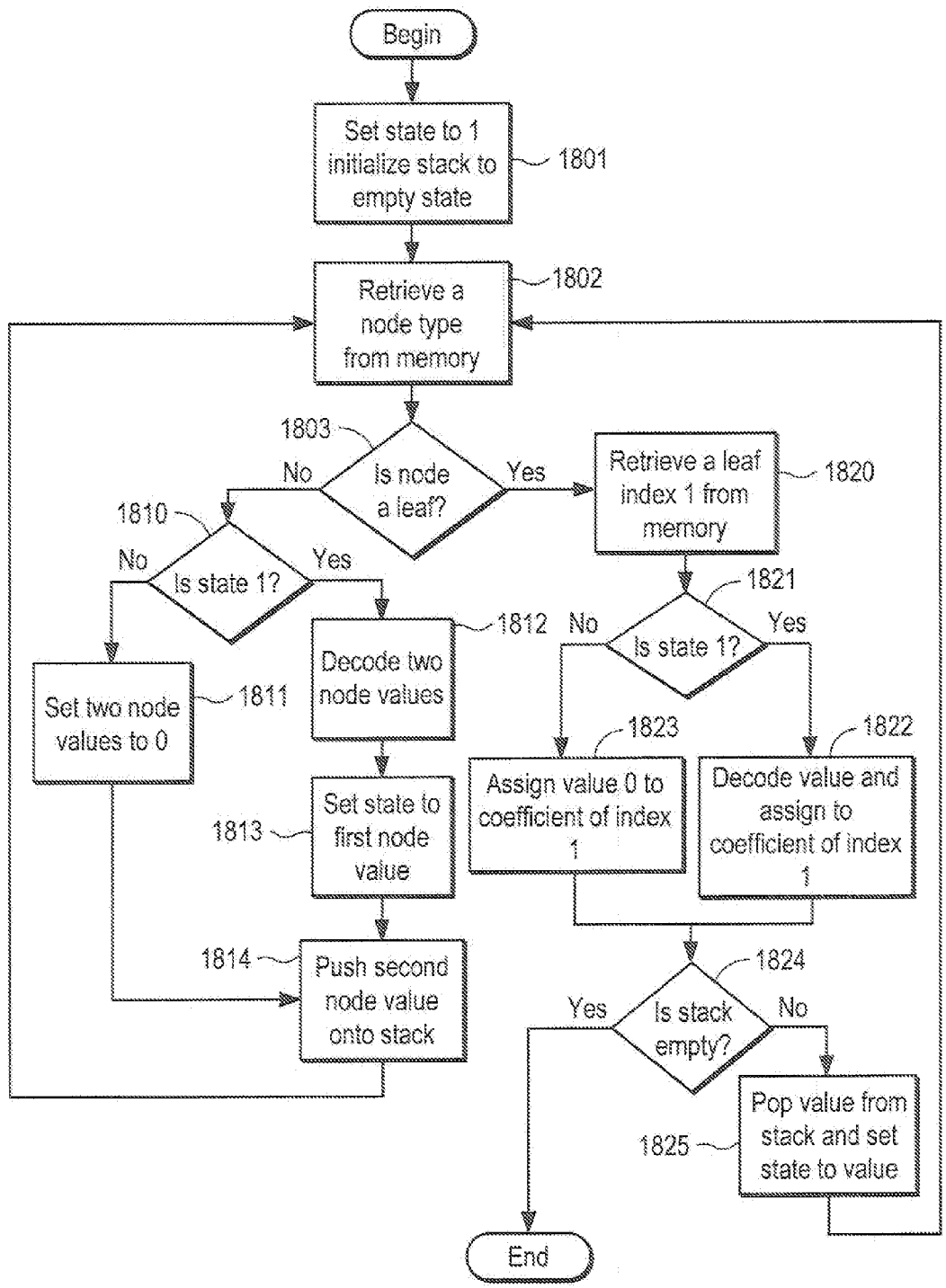
FIG. 18 is a flow diagram of one embodiment of a process for decoding quantized coefficients.

FIG. 18 is a flow diagram of one embodiment of a process for decoding quantized coefficients. The process is performed by processing logic that may comprise hardware (e.g., circuitry, dedicated logic, etc.), software (such as is run on a general purpose computer system or a dedicated machine), or a combination of both. The processing logic may also comprise firmware.

Referring to FIG. 18, the process begins by processing logic setting a state to 1 and initializing a stack to the empty state (processing block 1801). Then, processing logic retrieves a node type from a memory (processing block 1802). Processing logic then determines if a node is a leaf node (processing block 1803). If the node type indicates a leaf node, processing transitions to processing block 1820; otherwise, processing transitions to processing block 1810.

At processing block 1820, processing logic retrieves a leaf index I is retrieved from memory and tests whether the state has a value 0 (processing block 1821). If the state has value 0, processing transitions to processing block 1823 where processing logic assigns a value 0 to the coefficient with index I and thereafter processing transitions to processing block 1824; otherwise, processing transitions to processing block 1822 where processing logic decodes a coefficient value from the bit stream, assigns the decoded coefficient value to the coefficient with index I, and thereafter processing transitions to processing block 1824.

At processing block 1824, processing logic determines whether the stack is empty. If the stack is empty, the process ends; otherwise, processing transitions to processing block 1825 where processing logic pops a value from the stack and sets the state to the value. Afterwards, processing transitions to processing block 1802.

If the node is not a leaf node (processing block 1803), processing logic determines whether the state is equal to 1 (processing block 1810). If not (i.e., the value is 0), then processing logic sets two nodes values to zero and transitions to processing block 1814. If it is, processing decodes two node values from the bit stream (processing block 1812). Examples of methods for decoding the node values are described in FIGS. 15 and 16. After decoding the two nodes values, processing logic sets the state to the first node value (processing block 1813) and transitions to processing block 1814. At processing block 1814, processing logic pushes the second node value onto the stack. Thereafter, processing transitions to processing block 1802.

Figure 19:
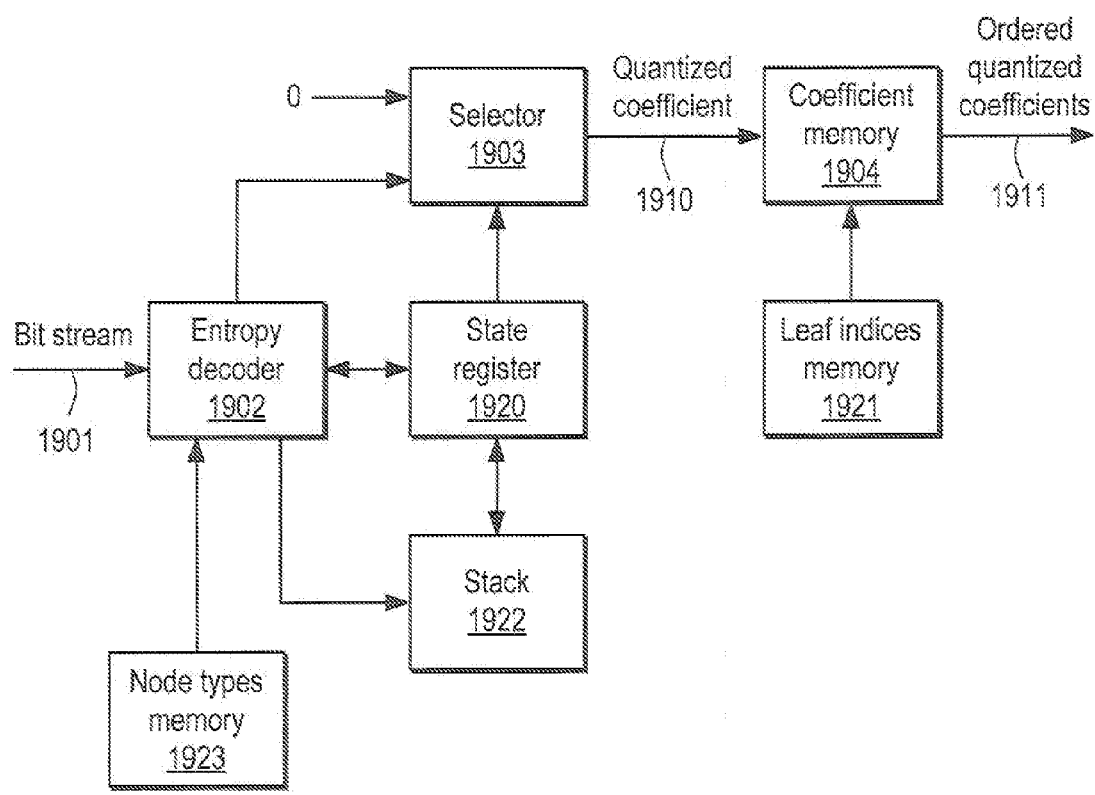
FIG. 19 is a block diagram of one embodiment of a coefficient decoder.

FIG. 19 is a block diagram of one embodiment of a coefficient decoder. Referring to FIG. 19, the coefficient decoder includes a state register 1920. In one embodiment, state register 1920 is initially set to a value 1. An entropy decoder 1902 retrieves a node type from a node types memory 1923. Node types memory 1923 contains data about the structure of a tree, as described in FIG. 4. If the node type indicates a leaf node and the value of the state register is 1, then entropy decoder 1902 decodes from the bit stream a quantized coefficient and transmits it to a selector 1903. Selector 1903 selects the quantized coefficient and transmits it to a coefficient memory 1904. The index into coefficient memory 1904 is determined by a leaf index retrieved from a leaf indices memory 1921. Otherwise, if state register 1920 is 0, selector 1903 selects a value 0 and transmits it to coefficient memory 1904. After a quantized coefficient is stored into quantized coefficient memory 1904, a value is popped from stack 1922 and is assigned to state register 1920. Otherwise, if the node type does not indicate a leaf node, the coefficient decoder operates as follows. If state register 1920 is 1, entropy decoder 1902 decodes from bit stream 1901 two node values, for example as described in FIGS. 15 and 16. A first node value is assigned to state register 1920 by entropy decoder 1902 and a second node value is pushed onto stack 1922 by entropy decoder 1902. Otherwise, if state register 1920 is 0, then the contents of state register 1920 are pushed onto the stack.

In one embodiment, the decoder operates is this fashion until all quantized coefficients in the quantized coefficients memory have been assigned a value. The content of the quantized coefficients memory is then output as an ordered set of quantized coefficients.

As claimed above, the techniques described herein may be applied to any vector of data. For example, the techniques may be used when video coding b-frames to code a vector of dimension four that includes a block of data that has horizontal and vertical displacements corresponding to a forward motion vector and horizontal and vertical displacements corresponding to a backward motion vector. In this case, the techniques described herein may be used to indicate which are not zero.

EXAMPLES OF CODE

Below is sample C code that may be used to decode coefficients as described in this invention. Examples for depth-first and breadth-first traversal of the tree are provided.

```
// sample decoder using depth -first traversal
#define N 16 // example with 16 coefficients
int nodes_types; // contains values of node types
int leaf_indices [N]; // contains indices of leaves
void decode_coefficients(int coefficients[N]) {
    int node, state, stack, index, val , first, second ;
    index = 0;
    state = entropy_decod_root_value ( ) ;
    stack = 0; // any value may be used in this example
    for (node=0; node <2*N+1; node++) {
        if ((node_types>>node) & 1) {
            if (state == 0)
                val = 0;
            else
                val = entropy_decode_coefficient ( ) ;
            coefficients[leaf_indices[index++]] = val;
            state = stack & 1;
            stack = stack >> 1;
        }
        else {
            stack = stack << 1;
            if (state == 1) {
                entropy_decode_node_values(&first, &second);
                state = first;
                stack = stack | second;
            }
        }
    }
}
// sample decoder using breadth -first traversal
// node_types and leaf_indices need to be changed accordingly
#define N 16 // example with 16 coefficients
int node_types; // contains values of node types
int leaf_indices[N]; // contains indices of leaves
void decode coefficients(int coefficients[N] ) {
    int node, queue, index, val, first, second, tail;
    index = 0;
    tail = 0;
    state = entropy_decode_root_value( ) ;
    queue = state << tail++;
    for (node=0; node <2*N+1; node++) {
        if ( (node_types >>node) & 1) {
            if ((queue>>node) & 1)
                val = entropy_decode_coefficient ( );
            else
                val = 0;
            coefficients[leaf_indices[index++]] = val;
        }
        else {
            if ((queue>>node) & 1) {
                entropy_decode_node_values(&first, &second);
                queue = queue | first << tail++;
                queue = queue | second << tail++;
            }
        }
    }
}
```

Adequate tree structure data may be derived from a set of coefficient blocks. Below is sample C-code that constructs such tree structure data from a set of statistics indicating with which frequency each combination of coefficients are non-zero.

```
#include <stdio.h>
#include <math.h>
int param[47]; // contains tree structure data
int p0, p1;
double *min_entropy;
int *best_submask;
int *best_hist[3];
// compute entropy of a histogram
double entrop (int *hist, int n) {
    int i, sum;
    double ent;
    ent = 0.0;
    sum = 0;
    for (i=0; i<n; i++)
        if (hist [i] != 0) {
            sum += hist[i];
            ent -= hist[i] * log(hist[i]);
        }
    if (sum != 0)
        ent += sum*log(sum);
    ent /= log(2.0);
    return ent;
}
void split(int mask, int *stats) {
    int hist[3];
    int i,j,m,ncoeff;
    double e;
    // count number of coefficients in set defined by mask
    ncoeff = 0;
    for (i=0; i<16; i++)
        ncoeff += (mask >> i) & 1;
    if (ncoeff <= 1) { // if only one, cannot further split
        min_entropy[mask] = 0.0;
        best_submask[mask] = mask;
    }
    else {
        min_entropy[mask] = 1e38;
        for (m=1; m <= (mask>>1); m++) {
            if ((m & mask) != m)
                continue;
            e = min_entropy[m] = min_entropy[m^mask];
            if (e >= min_entropy[mask])
                continue;
            for (i=0; i<3; i++)
                hist[i] = 0;
            for (i=0; i<65536; i++)
                if ((i & mask) != 0) {
                    j = (i & m) != 0;
                    j += (i & (m ^ mask) ) == 0;
                    // value of j:
                    // 0: first child = 0, second child = 1
                    // 1: first child = 1, second child = 1
                    // 2: first child = 1, second child = 0
                    hist[j] += stats[i];
                }
            e += entrop(hist, 3);
            if (e < min_entropy[mask]) {
                min_entropy[mask] = e;
                best_submask[mask] = m;
                for (j=0; j<3; j++)
                    best_hist[j] [mask] = hist[j];
            }
        }
    }
    printf("%4x %f     \r", mask min_entropy);
    fflush(stdout);
}
void printtree (int mask) {
    int i;
    int c0, c1;
    if (best_submask[mask] != mask) {
        printf("X ");
        param[p0++] = 1;
        printtree (best_submask[mask]);
        printtree (best_submask[mask] ^ mask);
    }
```

-continued

```
  else {
    i = 0;
    while (mask != (1 <<i) )
      i++;
    param[p0++] = 0;
    param[p1++] = i;
    printf ("%d ", i);
  }
}
main ( ) {
  FILE *f1;
  FILE *f4;
  int i, j;
  int stats [65536];
  char filename [256];
  int cnt;
  int step, type;
  int z2;
  int intra;
  min_entropy = new double [65536];
  best_submask = new int[65536];
  for (i=0; i<3; i++)
    best_hist[i] = new int[65536];
  f1 = fopen ("freq.txt", "r");
  for (i=0; i<65536; i++) {
    fscanf (f1, "%d", &cnt );
    stats[i] += cnt;
  }
  fclose (f1);
  stats[0] = 0;
  printf { "%f\n", entrop(stats, 65536) );
  step = 1;
  for (i=step p; i<0x10000; i+=step)
    split (i, stats);
  printf ("Minimum entropy: %f \n", min_entropy[0x10000 -step]);
  p0 = 0;
  p1 = 31;
  printtree (0x10000 -step);
  printf ("\n");
  f4 = fopen ("tree.txt", "w");
  for (i=0; i<47; i++)
    fprintf (f4, "%d ", param[i]);
  frprintf (f4, "\n");
  fclose (f4);
}
```

An Exemplary Computer System

Figure 20:
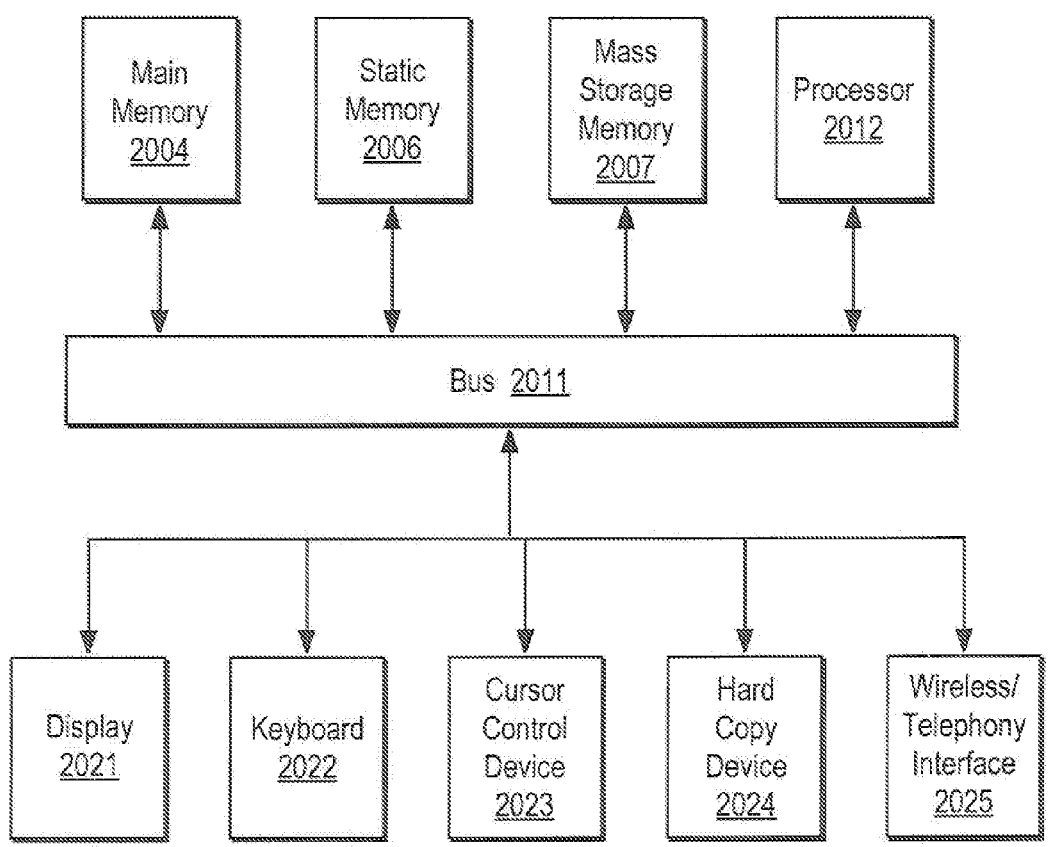
FIG. 20 is a block diagram of one embodiment of a computer system.

FIG. 20 is a block diagram of an exemplary computer system that may perform one or more of the operations described herein. Computer system 2000 may comprise an exemplary client or server computer system. Components described with respect to the computer system may be part of a handheld or mobile device (e.g., a cell phone).

Referring to FIG. 20, computer system 2000 comprises a communication mechanism or bus 2011 for communicating information, and a processor 2012 coupled with bus 2011 for processing information. Processor 2012 includes a microprocessor, but is not limited to a microprocessor, such as, for example, Pentium™ processor, etc.

System 2000 further comprises a random access memory (RAM), or other dynamic storage device 2004 (referred to as main memory) coupled to bus 2011 for storing information and instructions to be executed by processor 2012. Main memory 2004 also may be used for storing temporary variables or other intermediate information during execution of instructions by processor 2012.

Computer system 2000 also comprises a read only memory (ROM) and/or other static storage device 2006 coupled to bus 2011 for storing static information and instructions for processor 2012, and a data storage device 2007, such as a magnetic disk or optical disk and its corresponding disk drive.

Data storage device 2007 is coupled to bus 2011 for storing information and instructions.

Computer system 2000 may further be coupled to a display device 2021, such as a cathode ray tube (CRT) or liquid crystal display (LCD), coupled to bus 2011 for displaying information to a computer user. An alphanumeric input device 2022, including alphanumeric and other keys, may also be coupled to bus 2011 for communicating information and command selections to processor 2012. An additional user input device is cursor control 2023, such as a mouse, trackball, trackpad, stylus, or cursor direction keys, coupled to bus 2011 for communicating direction information and command selections to processor 2012, and for controlling cursor movement on display 2021.

Another device that may be coupled to bus 2011 is hard copy device 2024, which may be used for marking information on a medium such as paper, film, or similar types of media. Another device that may be coupled to bus 2011 is a wired/wireless communication capability 2025 to communication to a phone or handheld palm device.

Note that any or all of the components of system 2000 and associated hardware may be used in the present invention. However, it can be appreciated that other configurations of the computer system may include some or all of the devices.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. A method comprising:

receiving, by a processor, data elements of a vector generated from an image;

coding, by a processor, the data elements that are identified as non-zero, based on indications of which of the data elements are non-zero as identified by a tree data structure representing a tree, the tree having leaf nodes with each leaf node associated with one of the data elements; and producing, by a processor, a bit stream based on coded data, wherein the bit stream is a compressed representation of the image.

2. The method defined in claim 1 wherein the tree comprises a binary tree.

3. The method defined in claim 1 wherein coding the data elements comprises coding positions of non-zero coefficients in a block of coefficients.

4. The method defined in claim 3 wherein producing the bit stream based on coded data comprises producing coded non-zero coefficients of the block of coefficients.

5. The method defined in claim 3 wherein coding positions of non-zero coefficients in the group of coefficients comprises traversing the tree.

6. The method defined in claim 3 wherein the non-zero coefficients comprise quantized coefficients, and further comprising:

retrieving the tree data structure;

assigning a value to each leaf node of the tree described by the tree data structure;

assigning a value to nodes of the tree other than leaf nodes based on the values of the leaf nodes; and traversing the tree and encoding the values of the nodes of the tree into the bit stream, including encoding the values of non-zero coefficients into the bit stream.

7. The method defined in claim 6 wherein the tree is a binary tree.

8. The method defined in claim 6 further comprising encoding the tree structure into the bit stream.

9. An apparatus for encoding coefficients comprising:
an input to receive data elements of a vector generated from an image; and
an entropy encoder, comprising hardware and coupled to the input, to code the data elements in the vector that are identified as non-zero, based on indications of which of the data elements are non-zero as identified by a tree data structure representing a tree, the tree having leaf nodes with each leaf node associated with one of the data elements.

10. The apparatus defined in claim 9 wherein the tree comprises a binary tree.

11. The apparatus defined in claim 9 wherein the entropy encoder codes positions of non-zero coefficients in a block of coefficients.

12. The apparatus defined in claim 11 wherein the entropy encoder produces coded non-zero coefficients of the block of coefficients.

13. The apparatus defined in claim 11 wherein the entropy coder codes positions of non-zero coefficients in the group of coefficients by traversing the tree.

14. The apparatus defined in claim 11 wherein the non-zero coefficients comprise quantized coefficients, and further comprising:
a memory to store the tree data structure; and
a tree generator to assign values to the leaf nodes of the tree based on the quantized coefficients and recursively assign values to all other nodes in the tree based on the values assigned to the leaf nodes, and wherein the an entropy encoder operates to recursively encode values of the nodes of the tree generated by the tree generator, including values of non-zero quantized coefficients.

15. The apparatus defined in claim 14 wherein the entropy encoder retrieves the tree data structure from the memory, assigns a value to each leaf node of the tree described by the tree data structure corresponding to the quantized coefficients, assigns a value to nodes of the tree other than leaf nodes based on the values of the leaf nodes, and traverses the tree and encoding the values of the nodes of the tree into a bit stream, including encoding the values of non-zero coefficients into the bit stream.

16. The apparatus defined in claim 15 wherein the tree is a binary tree.

17. The apparatus defined in claim 15 wherein the entropy encodes the tree data structure into the bit stream.

18. A tangible computer-readable storage medium storing instructions which, when executed by a processor, cause the processor to perform a method comprising:
coding data elements of an image in a vector that are identified as non-zero, based on indications of which of the data elements are non-zero as identified by a tree data structure representing a tree, the tree having leaf nodes with each leaf node associated with one of the data elements; and
producing a bit stream based on coded data, wherein the bit stream is a compressed representation of the image.

19. A method comprising:
receiving, by a processor, a bit stream, wherein the bit stream is a compressed representation of an image; and
decoding, by the processor, the bit stream to produce a vector of decoded data elements based on indications of which of the decoded data elements are non-zero as identified by a tree data structure representing a tree, wherein the vector of decoded data elements is a reconstructed version of the image, the tree has leaf nodes with each leaf node associated with one of the decoded data elements.

20. The method defined in claim 19 wherein the tree comprises a binary tree.

21. The method defined in claim 19 wherein decoding coded data comprises decoding positions of non-zero coefficients of the block of coefficients.

22. The method defined in claim 21 wherein decoding positions of non-zero coefficients in the group of coefficients comprises traversing the tree.

23. The method defined in claim 19 further comprising:
retrieving the tree data structure;
traversing the tree;
decoding the values of nodes of the tree from the bit stream;
decoding a value of a quantized coefficient from the bit stream for each leaf node that has a first value; and
assigning a value zero to a quantized coefficient for each leaf node that has a second value.

24. The method defined in claim 23 wherein the tree is a binary tree.

25. The method defined in claim 23 further comprising decoding the tree structure from the bit stream.

26. The method defined in claim 19 further comprising:
recursively decoding, from the bit stream, values of nodes of the tree based on the tree data structure;
decoding a quantized coefficient for each leaf node that has a first value; and assigning a value of 0 to a quantized coefficient for each leaf node that has a second value.

27. An apparatus for decoding quantized coefficients comprising:
an input to receive a bit stream, wherein the bit stream is a compressed representation of an image; and
an entropy decoder, comprising hardware and coupled to the input, to produce a vector of decoded data elements based on indications of which of the decoded data elements are non-zero as identified by a tree data structure representing a tree, wherein the vector of decoded data elements is a reconstructed version of the image, the tree has leaf nodes with each leaf node associated with one of the decoded data elements.

28. The apparatus defined in claim 27 further comprising a memory to store the tree data structure, and wherein the entropy decoder recursively decodes, from the bit stream, values of nodes of the tree based on the tree data structure, decodes a quantized coefficient for each leaf node that has a first value, and assigns a value of 0 to a quantized coefficient for each leaf node that has a second value.

29. The apparatus defined in claim 27 wherein the tree comprises a binary tree.

30. The apparatus defined in claim 27 wherein the vector of decoded data comprises a block of coefficients.

31. The apparatus defined in claim 27 wherein the entropy decoder decodes the bitstream comprises traversing the tree.

32. The apparatus defined in claim 27 wherein the previously generated data structure comprises the tree data structure, and wherein the entropy decoder retrieves the tree data structure, traverses the tree, decodes the values of nodes of the tree from the bit stream, decodes a value of a quantized coefficient from the bit stream for each leaf node that has a first value, and assigns a value zero to a quantized coefficient for each leaf node that has a second value.

33. The apparatus defined in claim 32 wherein the tree is a binary tree.

34. The apparatus defined in claim 32 wherein the entropy decoder decodes the tree data structure from the bit stream.

35. A tangible computer-readable storage medium storing instructions which, when executed by a processor, cause the processor to perform a method comprising:
decoding a bit stream to produce a vector of decoded data based on indications of which of the decoded data elements are non-zero as identified by a tree data structure representing a tree, wherein the bit stream is a compressed representation of an image and the vector of decoded data is a reconstructed version of the image, the tree has leaf nodes with each leaf node associated with one of the decoded data elements.

36. The method defined in claim 1 further comprising sending the tree data structure.

37. The method defined in claim 36 wherein tree data structure is sent in the bit stream as compressed data.

38. The method defined in claim 36 wherein the tree data structure is for a block of data and is sent for the block of data.

39. The method defined in claim 36 wherein the tree data structure is sent once per picture, once per group of pictures or once per video sequence.

40. The computer-readable storage medium defined in claim 18 wherein the method further comprises sending the tree data structure.

41. The computer-readable storage medium defined in claim 40 wherein tree data structure is sent in the bit stream as compressed data.

42. The computer-readable storage medium defined in claim 40 wherein the tree data structure is for a block of data and is sent for the block of data.

43. The computer-readable storage medium defined in claim 40 wherein the tree data structure is sent once per picture, once per group of pictures or once per video sequence.

44. The method defined in claim 19 further comprising receiving the tree data structure.

45. The method defined in claim 44 wherein tree data structure is sent as part of the bit stream.

46. The method defined in claim 44 wherein the tree data structure is for a block of data and is received for the block of data.

47. The method defined in claim 44 wherein the tree data structure is received once per picture, once per group of pictures or once per video sequence.

48. A method comprising:
receiving, by a processor, a vector of data elements generated from an image;
encoding, by a processor, values of nodes of a tree that identifies which data elements in said vector are non-zero, wherein each leaf node of said tree is associated with one data element of said vector;
encoding, by a processor, values of non-zero data elements of said vector, wherein the non-zero data elements are identified by said tree;
outputting a bit stream including encoded values of the nodes of said tree and encoded values of the non-zero data elements.

49. A method as in claim 48, wherein the tree comprises a binary tree.

50. A method as in claim 48, wherein encoding values of nodes of a tree comprises traversing the tree in depth-first order.

51. A method as in claim 48, wherein the bit stream further includes tree structure data representative of a structure of said tree and a mapping of data element positions in said vector to leaf nodes in said tree.

52. A method as in claim 48, wherein:
each leaf node in the tree is assigned a first value if the associated data element is non-zero, and a second value otherwise;
each non-leaf node in the tree is assigned said first value if at least one of its children has said first value, and said second value otherwise.

53. A method as in claim 52 wherein encoding is skipped for nodes of which the parent node has said second value.

54. A method as in claim 48 wherein encoding comprises arithmetic encoding.

55. A method as in claim 48 wherein the tree includes at least one node of which none of the child nodes is a leaf node.

56. A method as in claim 48 wherein data elements are transform coefficients.

* * * * *

UNITED STATES PATENT AND TRADEMARK OFFICE
CERTIFICATE OF CORRECTION

PATENT NO. : 7,660,475 B2  Page 1 of 1
APPLICATION NO. : 11/172052
DATED : February 9, 2010
INVENTOR(S) : Frank Bossen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 951 days.

Signed and Sealed this

Thirtieth Day of November, 2010

David J. Kappos
*Director of the United States Patent and Trademark Office*